(12) United States Patent
Ding et al.

(10) Patent No.: US 7,272,807 B2
(45) Date of Patent: Sep. 18, 2007

(54) DETERMINING EQUIVALENT WAVEFORMS FOR DISTORTED WAVEFORMS

(75) Inventors: Li Ding, Sunnyvale, CA (US); Peivand Fallah Tehrani, Camarillo, CA (US); Alireza Kasnavi, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 406 days.

(21) Appl. No.: 11/071,121

(22) Filed: Mar. 2, 2005

(65) Prior Publication Data
US 2006/0200784 A1 Sep. 7, 2006

(51) Int. Cl.
G06F 17/50 (2006.01)
(52) U.S. Cl. ............................ 716/6; 716/1; 716/4
(58) Field of Classification Search ............... 716/1, 716/4, 6, 18; 703/14
See application file for complete search history.

(56) References Cited

U.S. PATENT DOCUMENTS

| 6,167,561 A | 12/2000 | Chen et al. ............... 716/18 |
| 6,507,935 B1 | 1/2003 | Aingaran et al. ............ 716/5 |
| 6,637,014 B2 | 10/2003 | Casavant .................... 716/6 |
| 2005/0232066 A1* | 10/2005 | Ishibashi et al. ........... 365/233 |

OTHER PUBLICATIONS

M. Hashimoto, Y. Yamada, H. Onodera, "Equivalent Waveform Propagation For Static Timing Analysis", JCCAD '03, Nov. 11-13, 2003, San Jose, California, USA Copyright 2003, ACM 1-5813-762-1/03/0011, pp. 169-175.

P. Tehrani, S. W. Chyou, U. Ekambaram, "Deep Sub-Micron Static Timing Analysis in Presence of Crosstalk", 2000 IEEE, 0-7695-0525-2/00, pp. 505-512.

M. Hashimoto, Y. Yamada, H. Onodera, "Capturing Crosstalk-Induced Waveform for Accurate Static Timing Analysis", ISPD '03, Apr. 6-9, 2003, Monterey, California, USA, Copyright 2003 ACM 1-58113-650-1/03/0004, pp. 18-23.

White Paper, "Noise-Aware Timing Analysis", 2001 Candence Design Systems, Inc., Stock #3082 May 2001, (9 total pages).

White Paper, "Signal Integrity Sign-Off", © 2003 Synopsys, Inc. (13 total pages).

* cited by examiner

*Primary Examiner*—Thuan Do
(74) *Attorney, Agent, or Firm*—Silicon Valley Patent Group LLP

(57) ABSTRACT

An equivalent waveform for a distorted waveform used in timing and signal integrity analysis in the design of an integrated circuit is automatically generated. The equivalent waveform is produced by calculating the transition quantity of a first non-distorted waveform. The transition quantity is the amount of transition of the first non-distorted waveform that is required for the cell to produce an output waveform with a predetermined end voltage. The end point of the transition period for the distorted waveform is then determined based on when the distorted waveform has accumulated the same transition quantity. The equivalent waveform can then be formed by computing a second non-distorted waveform such that the end point of the transition period for the second non-distorted waveform coincides with the end point of the transition period for the distorted waveform.

19 Claims, 6 Drawing Sheets

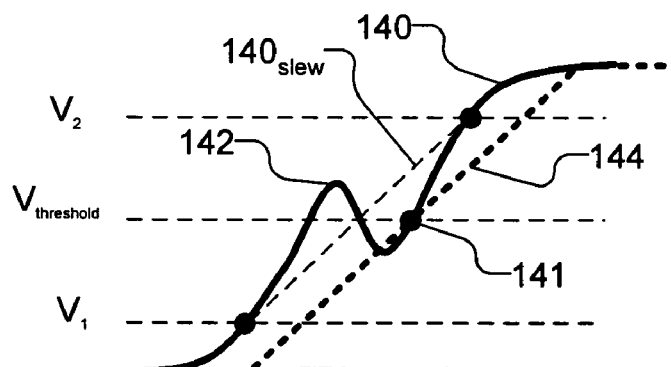
Fig. 3
(Conventional)

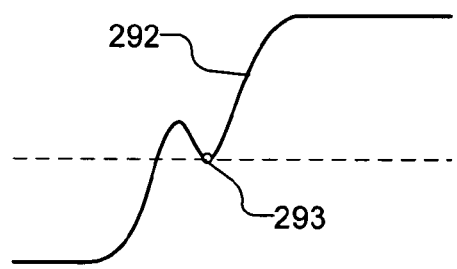
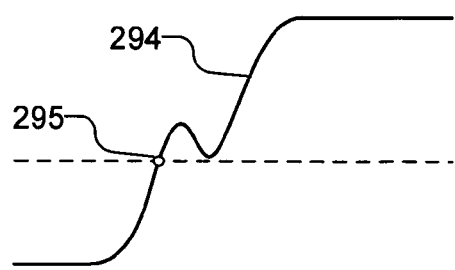
Fig. 6A        Fig. 6B
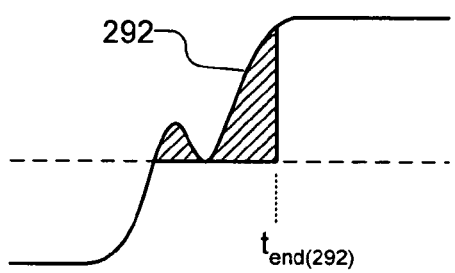
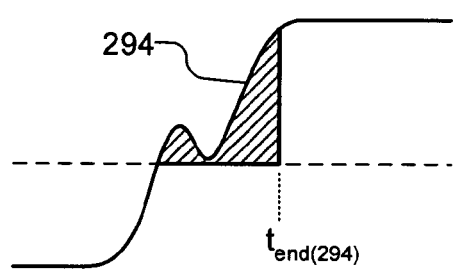
Fig. 7A        Fig. 7B
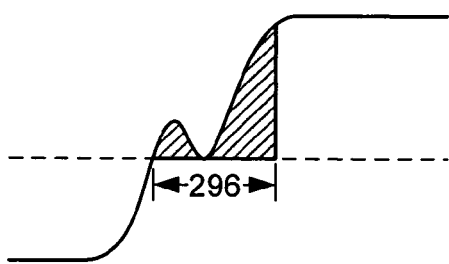
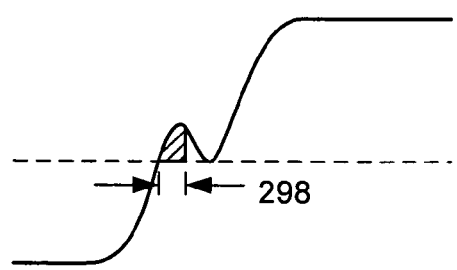
Fig. 8A        Fig. 8B

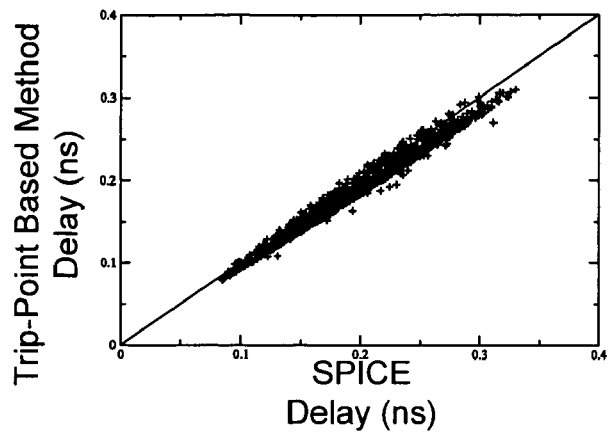
Fig. 9A
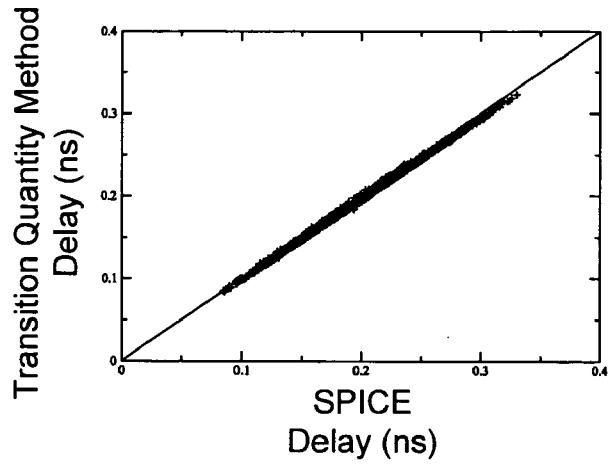
Fig. 9B
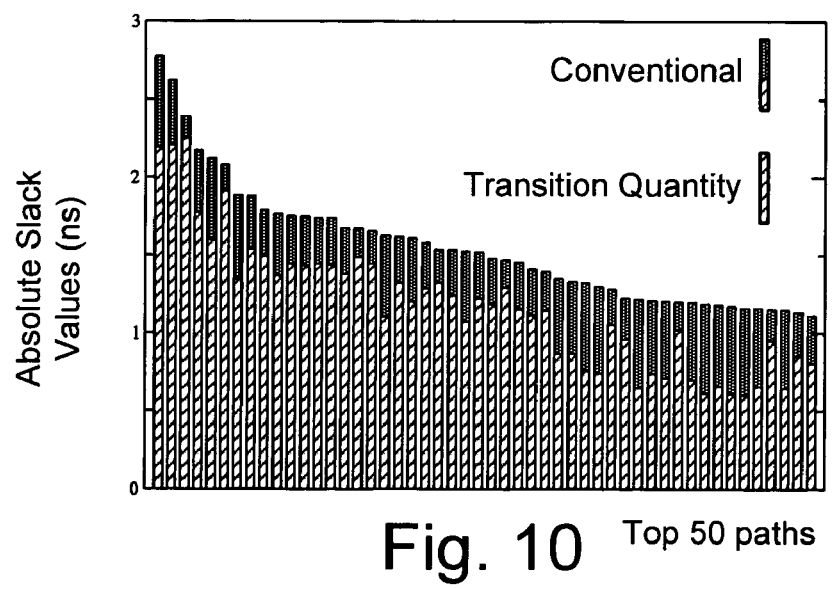
Fig. 10   Top 50 paths

DETERMINING EQUIVALENT WAVEFORMS FOR DISTORTED WAVEFORMS

BACKGROUND

1. Field of the Invention

The present invention relates to the design of semiconductor chips. More specifically, the present invention relates to a method and an apparatus for generating equivalent waveforms used in timing analysis and in signal integrity analysis for an integrated circuit design.

2. Related Art

Timing and signal integrity are ever increasingly important issues in integrated circuit design, particularly due to the increase in clock frequency, chip size and the decrease in device geometry and desired power consumption. Timing analysis, such as static timing analysis, is used to verify, and aid in the correction of chip timing problems. In general, static timing analysis compares the worst case timing of all possible paths between an input signal and an output signal to a preset criterion. Timing analysis is typically performed at the transistor or cell level using libraries of information, such as delay and slew, based on simple input waveforms for the transistor or cell.

One of the most common sources of timing and signal integrity errors is crosstalk, which is mainly due to the capacitive coupling of adjacent conductors. Crosstalk generally causes a distortion in the waveform of an input signal, which may result in incorrect logic transition, e.g., a gate may switch at an incorrect time, or delay variations on a signal line. The delay variation may propagate downstream and cause a timing violation in other parts of the circuit. Accordingly, it is important to account for crosstalk in timing analysis by accurately modeling the actual distorted waveform with an equivalent waveform that represents the actual distorted waveform.

SUMMARY

An equivalent waveform that is generated, in accordance with an embodiment of the present invention, based on the quantity or amount of transition that is necessary for an element of an integrated circuit design, such as a cell or transistor, to produce a desired output waveform. The use of a quantitative characteristic of the input waveform, such as the amount of transition, advantageously produces an accurate equivalent waveform that can be derived quickly, i.e., in real time calculations, using only the characteristics of the cell or transistor that are conventionally stored in the library, i.e., delay and slew.

In one embodiment, a method of generating an equivalent waveform includes automatically generating a first non-distorted input waveform for an element in an integrated circuit design. The transition quantity for the non-distorted input waveform is automatically computed, where the transition quantity is the amount of transition required for the element to produce an output waveform, the transition quantity being determined during a first transition period. The end of a second transition period is automatically determined for the distorted input waveform during which the distorted input waveform accumulates the same transition quantity. The equivalent waveform is then formed by automatically computing a second non-distorted input waveform having the same transition quantity as the distorted input waveform and having a transition period that terminates at the same time as at the end of the second transition period, wherein the second non-distorted input waveform is the equivalent waveform. In one embodiment, the second non-distorted input waveform is formed by shifting the first non-distorted waveform such that the end point of the transition period for the non-distorted waveform coincides with the end point of the transition period for the distorted waveform. In another embodiment, the second non-distorted input waveform is formed by automatically scaling the first non-distorted input waveform to align the end of the first transition period for the first non-distorted input waveform with the end of the second transition period for the distorted input waveform, wherein the scaled non-distorted input waveform passes the last delay trip point of the said distorted input waveform, and wherein the scaled non-distorted input waveform is the second non-distorted input waveform.

Another embodiment of the present invention includes a computer comprising a processor and a memory coupled to the processor, the memory being encoded with instructions to generate the equivalent waveform of a distorted input waveform for an element in an integrated circuit design.

BRIEF DESCRIPTION OF THE FIGURES

FIG. 3 illustrates a distorted waveform and the equivalent waveform that is produced based on trip-point modeling.

FIGS. 6A and 6B illustrate the sensitivity of the conventional trip-point based method to the distorted waveforms crossing the threshold voltage.

FIGS. 7A and 7B illustrate the insensitivity of the present invention to the distorted waveforms crossing the threshold voltage.

FIGS. 8A and 8B illustrate modeling of the load dependency effect using the present invention.

FIGS. 9A and 9B illustrate the increased accuracy of the present invention relative to conventional trip-point based methods.

FIG. 10 illustrates the path slack comparison for conventional trip-point based method and the present invention.

DETAILED DESCRIPTION

Figure 1:
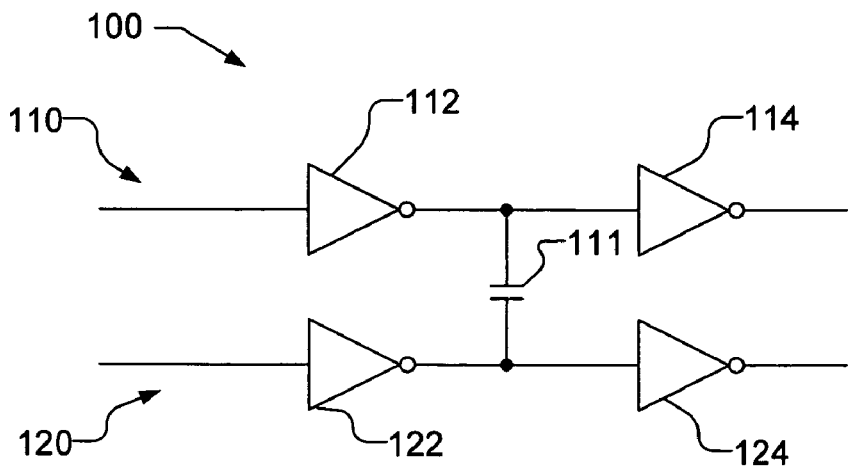
FIG. 1 schematically illustrates an example of a cross coupled circuit.

FIG. 1 schematically illustrates an example of a cross coupled circuit 100 that may have its timing analyzed using an equivalent waveform that is produced in accordance with an embodiment of the present invention. The cross coupled circuit 100 includes a primary line 110 that is coupled to an aggressor line 120 through cross coupling capacitance, shown as capacitor 111. The primary line 110 is illustrated as including an inverter 112 coupled to a second inverter 114 and the aggressor line 120 is similarly illustrated as an inverter 122 coupled to a second inverter 124. It should be understood that the cross coupled circuit 100 is merely exemplary and that the present invention may be used advantageously with any circuit that suffers from waveform distortion due to various reasons including, but not limited to, capacitive coupling, inductive coupling, inductive ringing, and resistive shielding effects.

Generally, each node in the cross coupled circuit 100 includes a self-capacitance, which can be modeled as a capacitor coupled to ground, which is not shown in FIG. 1 for the sake of clarity. With a large feature size, i.e., outside the sub-micron region, the values of the self capacitances are much larger than the cross coupling capacitance, illustrated by capacitor 111, and thus, cross coupling causes little error in the timing analysis. However, with smaller feature size, the cross coupling becomes larger with respect to the self capacitance, which results in the switching activities in the aggressor line 120 affecting the switching activities, and therefore the timing, in the primary line 110 (sometimes referred to as the victim line).

During the circuit design process, the timing of the design must be verified. In general, timing analysis of a circuit design is well known by those skilled in the art, and is described, e.g., in P. F. Tehrani et al., "Deep Sub-Micron Static Timing Analysis in Presence of Crosstalk", ISQED, pp. 505-512, 2000, and U.S. Pat. No. 6,167,561, all of which is incorporated herein by reference.

Figure 2:
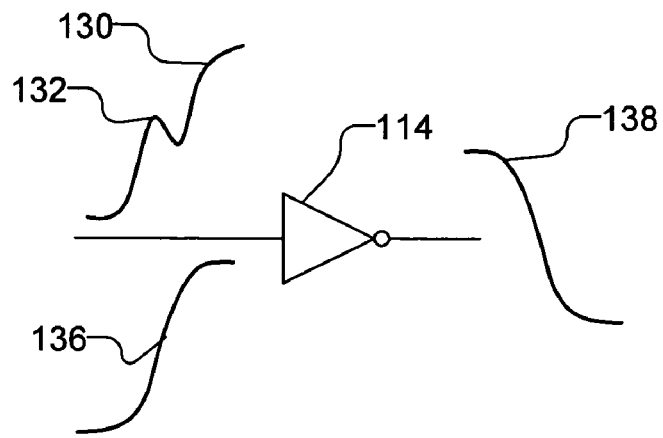
FIG. 2 illustrates an example of a distorted voltage waveform that is the input signal to inverter.

Crosstalk on the circuit, unfortunately, can complicate the timing analysis of the circuit. Crosstalk, for example, can result from switching activities on the aggressor line 120 that distort the signal waveform on the primary line 110, e.g., causing one or more localized maxima and minima on the waveform, seen as bump-like voltage fluctuations. FIG. 2 illustrates an example of a distorted voltage waveform 130 that is the input signal to inverter 114. As can be seen in FIG. 2, the distorted waveform 130 has a localized maximum 132, which is caused by capacitive coupling by, e.g., the aggressor line 120 shown in FIG. 1.

In order to improve the accuracy of the timing analysis, the distorted waveform 130 is modeled using an equivalent waveform 136, illustrated in FIG. 2. Ideally, the equivalent waveform 136 produces the same output response from inverter 114 as would be produced by the distorted waveform 130, i.e., output signal 138. In other words, the output signal 138 that is calculated based on the equivalent waveform 136 should have approximately the same characteristics, i.e., slew and delay, as the actual output signal that would be produced by inverter 114 from the actual distorted waveform 130.

Conventionally, timing analysis uses abstracted timing information for the circuit element, such as a cell or transistor, that is being analyzed. The timing information is stored in a library as, e.g., a look-up table. The timing information conventionally includes the input to output delay of the element and the output slew of the element as functions of input slew and capacitive loading. The delay of an element is measured as the time difference between the input and output voltages passing a delay threshold voltage, generally, 50 percent of the rail to rail voltage. The slew for an element is the time difference for a voltage signal to cross two preset voltage levels, e.g., 10 to 90 percent or 20 to 80 percent of the rail to rail voltage.

One conventional method of modeling a distorted waveform for timing analysis is based on trip-points of the waveform. In trip-point based modeling, an equivalent waveform for a distorted waveform is generated using points on the waveform that cross certain pre-selected threshold values. FIG. 3, for example, illustrates a distorted waveform 140 and the equivalent waveform 144 that is produced based on trip-point modeling. The equivalent waveform 144 is conventionally produced as an approximately linear waveform that has the same slew as the distorted waveform 140, illustrated as broken line $140_{slew}$, and is positioned such that it has the same delay trip point 141 as the distorted waveform 140, i.e., both cross the delay threshold voltage $V_{threshold}$ at the same time. As illustrated in FIG. 3, however, the presence of the localized maximum 142 on the distorted waveform 140 causes the distorted waveform to cross a delay threshold voltage $V_{threshold}$ multiple times. When output switching windows of the primary and aggressor lines 110 and 120 overlap, waveforms in primary line 110 will become distorted and their delays may be affected, i.e., increased or decreased depending on the aggressor's switching direction. Accordingly, when the equivalent waveform 144 matches the delay, slew of this waveform will not match the slew of the distorted waveform 140.

Other methods of producing an equivalent waveform for a distorted waveform for timing analysis include a least-square fitting technique in which the equivalent waveform is fit to the distorted input waveform as follows:

$$I_0 = \int_{t_1}^{t_2} (V_{in}(t) - V_{in}^*(t))^2 dt \qquad \text{eq. 1}$$

where $V_{in}(t)$ is a function that describes the actual distorted waveform and $V^*_{in}(t)$ is a function that describes the equivalent waveform that is to be produced. Alternatively, a weighted least-square fitting technique is sometimes used as follows:

$$I_1 = \int_{t_1}^{t_2} \left| \frac{\partial V_{out}}{\partial V_{in}} \right| (V_{in}(t) - V_{in}^*(t))^2 dt \qquad \text{eq. 2}$$

where $\partial V_{out}/\partial V_{in}$ is a weighting coefficient based on cell input and output voltages. In both of the methods described by eq. 1 and eq. 2, the objective is to minimize the values of $I_0$ and $I_1$, respectively.

While the least-square fitting and weighted least-square fitting methods are accurate, they are slow, making it inappropriate for real time static timing analysis. Moreover, the use of the weighting function requires the output voltage waveform $V_{out}$ which is not available from the library. Accordingly, the weighting function uses nominal waveforms to derive the output waveform, which may not match the waveform 140. Moreover, the weighting function may be an inappropriate approximation when the input waveform is very distorted.

In accordance with an embodiment of the present invention, an equivalent waveform is formed based on the quantity or "amount" of transition that is required of the input waveform to produce a desired output waveform for a circuit element. The use of such a quantitative characteristic, sometimes referred to herein as the "transition quantity" or "amount of transition", produces an accurate equivalent waveform that can be derived quickly, i.e., in real time calculations, while using only the characteristics of the cell that are conventionally stored in the library, i.e., delay and slew.

In one embodiment of the present invention, the transition quantity of the input waveform is determined by the weighted area between the curve that describes the input waveform and a predetermined threshold, e.g., transistor threshold voltage, the cell delay threshold or other appropriate threshold, during a specific transition period. The transition period starts when the input waveform crosses the predetermined threshold and ends when the output waveform reaches a predetermined end voltage, such as equal to or between 5 and 50 percent of the rail to rail voltage for falling output waveforms, and equal to or between 50 to 95 percent of the rail to rail voltage for rising output waveforms. The equivalent waveform is then produced based on the transition quantity of the actual distorted waveform.

Figure 4:
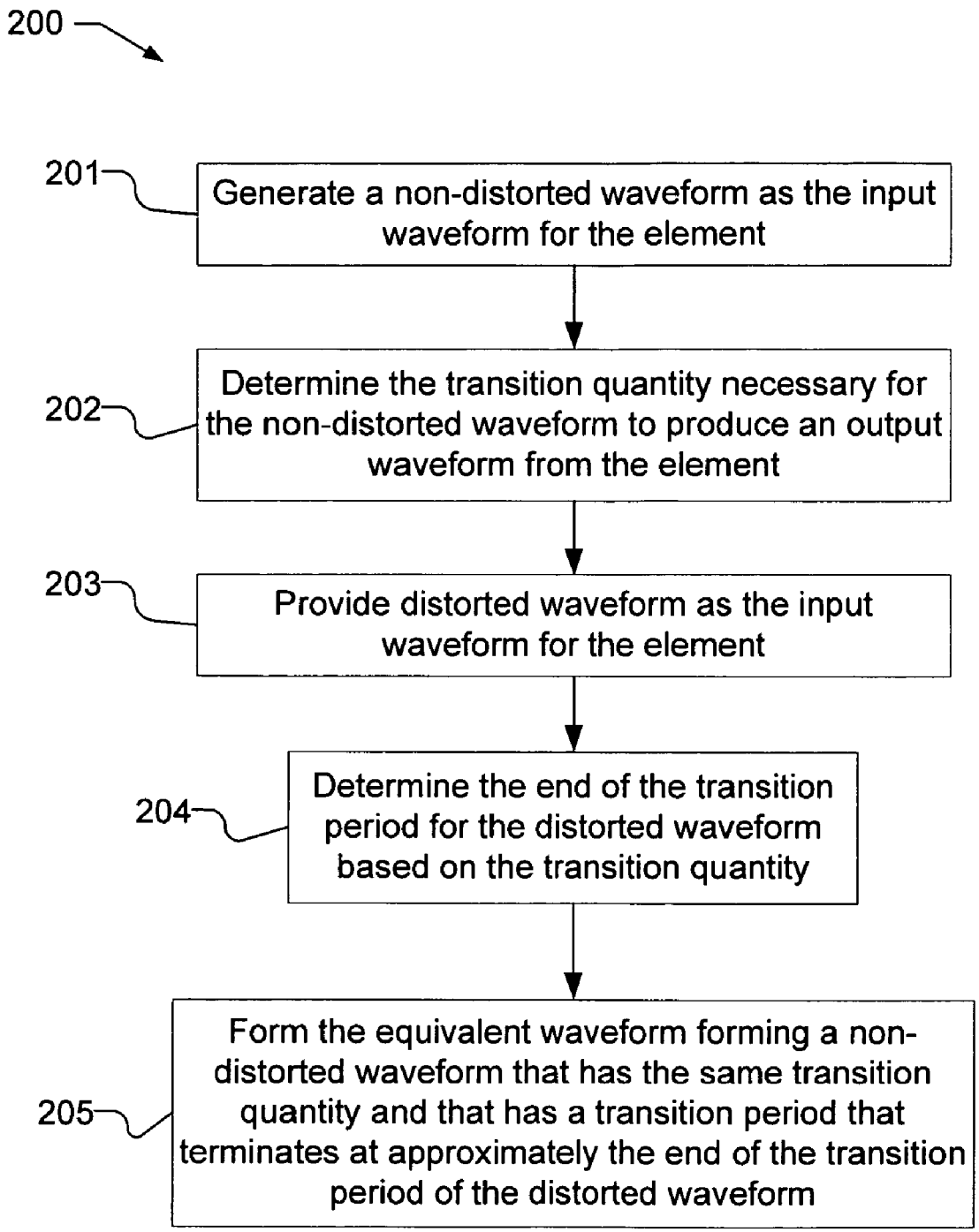
FIG. 4 is a flow chart of a method of forming an equivalent waveform in accordance with an embodiment of the present invention.
Figure 5A:
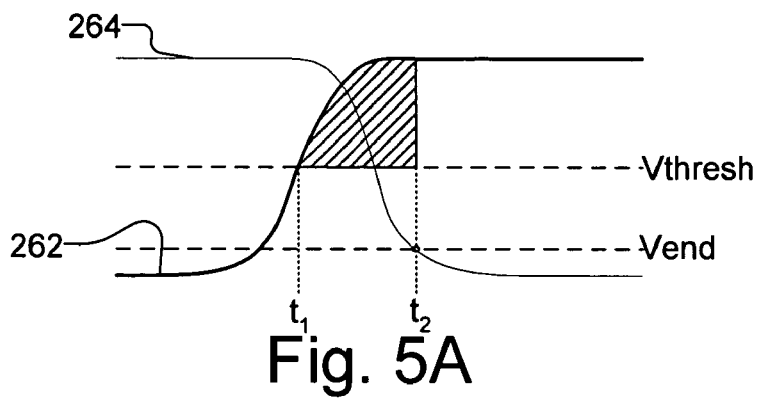
FIGS. 5A, 5B, 5C, and 5D graphically illustrate forming the equivalent waveform.
Figure 5B:
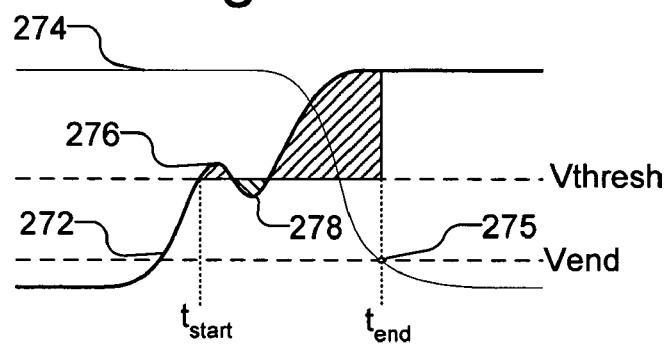
Figure 5C:
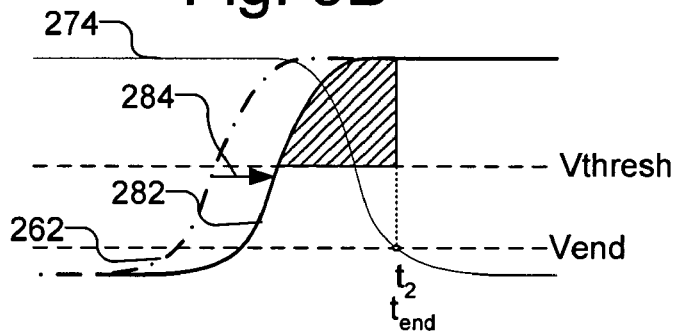

FIG. 4 is a flow chart 200 of a method of forming an equivalent waveform in accordance with an embodiment of the present invention. The method may be implemented by programming a computer to automatically perform acts 201-205, as described below. FIGS. 5A, 5B, and 5C, graphically illustrate forming the equivalent waveform. As shown in FIG. 4, a non-distorted waveform for the element under analysis is provided (block 201). The non-distorted waveform may be a saturated ramp waveform, a linear waveform with exponential tail, or any other monotonically rising or falling waveforms. It may also have characteristics, such as slew, based on the waveform at the same circuit node when there is no capacitive crosstalk effect. The amount of transition of the non-distorted waveform that is required to produce an output signal with a predefined voltage $V_{end}$ from the element is then quantified (block 202).

FIG. 5A graphically illustrates a non-distorted input waveform 262 and how to determine the transition quantity that is necessary for the non-distorted input waveform 262 to generate an output waveform 264. The shapes and relative positions of the non-distorted input waveform 262 and output waveform 264 are based on the library criteria of the element being analyzed, e.g., the input and output slews and the delay. The transition quantity of the non-distorted input waveform that is required to produce the output waveform, in one embodiment of the present invention, is defined as the area between the non-distorted input waveform 262 and the threshold voltage $V_{thresh}$ during a transition period, which begins when the non-distorted input waveform 262 crosses the threshold voltage $V_{thresh}$, at time t1, and ends when the output waveform cross the predefined voltage $V_{end}$, at time t2. The transition quantity is illustrated in FIG. 5A with cross-hatching. Mathematically, the transition quantity (TQ) may be written as:

$$TQ = \int_{t_1}^{t_2} (V_{in}(t) - V_{thresh})^\alpha dt \qquad \text{eq. 3}$$

where $V_{in}(t)$ describes the non-distorted input waveform 262, $V_{thresh}$ is the threshold voltage level, $\alpha$ is a weighting factor, $t_1$ is the time when the non-distorted input waveform 262 crosses the threshold voltage $V_{thresh}$, and $t_2$ is when the output voltage waveform 264 crosses the end voltage $V_{end}$. The value of time $t_2$ may be written as follows:

$$t_2 = t_1 + t_{delay} + 0.5 \cdot t_{slew} \qquad \text{eq. 4}$$

where $t_{delay}$ is the gate delay of the element and $t_{slew}$ is the slew of the output waveform.

The values of $\alpha$ and $V_{thresh}$ are empirically determined and may vary. By way of example, the value of $\alpha$ may be greater than or equal to 1 and is generally less than 2 and the value of $V_{thresh}$ may be transistor threshold voltage, cell delay trip point, or point when the input waveform will trigger the cell or logic gate to begin to change the condition of the output waveform and is generally between 0.2 to 0.5 of Vdd for rising input waveform. However, it should be understood that alternative threshold voltage levels $V_{thresh}$ may be used if desired. Moreover, the amount of transition may be determined in alternative manners.

As shown in FIG. 4, the distorted waveform is also provided (block 203). The distorted waveform may be determined by levelizing the design and calculating the distorted waveform at the input of a cell on-the-fly. Calculating a distorted waveform is described, e.g., in U.S. Pat. No. 6,167,561, which is incorporated herein by reference. Using the determined transition quantity and the distorted waveform, the transition period for the distorted waveform, and specifically, the end of the transition period, can be determined (block 204). The transition period for the distorted waveform is based on the time it takes the distorted waveform to accumulate the same transition quantity.

FIG. 5B graphically illustrates distorted input waveform 272 and determining the time (shown as $t_{end}$) when the actual distorted input waveform 272 has accumulated the transition quantity as the non-distorted input waveform 262 (shown in FIG. 5A). The time $t_{end}$, which denotes the end of the transition period of the distorted input waveform 272, may be determined from the following:

$$TQ = \int_{t_{start}}^{t_{end}} (V_{in}^*(t) - V_{thresh})^\alpha dt \qquad \text{eq. 5}$$

where $V^*_{in}(t)$ describes the distorted input waveform 272, $t_{start}$ is the time when the input waveform 272 crosses the threshold voltage $V_{thresh}$, and tend is the time when the distorted input waveform 272 has accumulated the same transition quantity previously determined. Once the actual distorted input waveform 272 has accumulated the same transition quantity, i.e., at time $t_{end}$, the actual output waveform 274 from the cell is expected to reach the end voltage $V_{end}$, illustrated in FIG. 5B by point 275.

As can be seen in FIG. 5B, the actual distorted input waveform 272 may cross the threshold voltage $V_{thresh}$ multiple times. Between times $t_{start}$ and $t_{end}$, any time the waveform falls below the threshold voltage $V_{thresh}$, the transition quantity must be correspondingly decreased, but should not be less than zero. Thus, for example, the transition quantity is increased during peak 276 and decreased during valley 278 as illustrated by the cross-hatching in FIG. 5B.

With the end of the transition period time ($t_{end}$) of the distorted waveform determined, the equivalent waveform can be produced by forming a non-distorted waveform that has the same transition quantity and that has a transition period that ends at the same time as the end of the transition period of the distorted waveform (block 205 in FIG. 4). The equivalent waveform may then be used in timing analysis or signal integrity analysis as desired.

In one embodiment, the equivalent waveform is formed by shifting the position of the first non-distorted waveform (from block 201) so that the end of the transition period of the non-distorted waveform coincides with the end of the transition period of the distorted waveform (block 205 in FIG. 4). In this embodiment, the delay of the non-distorted waveform is shifted, but the slew does not change. FIG. 5C graphically illustrates forming the equivalent waveform 282 by shifting the non-distorted input waveform 262 from its original position (indicated with the broken lines) as indicated by arrow 284, so that the end of the transition period of the non-distorted waveform, i.e., time $t_2$, coincides with the end of the transition period of the actual distorted input waveform 272, i.e., time $t_{end}$. The equivalent waveform may then be used in timing analysis or signal integrity analysis as desired.

Figure 5D:
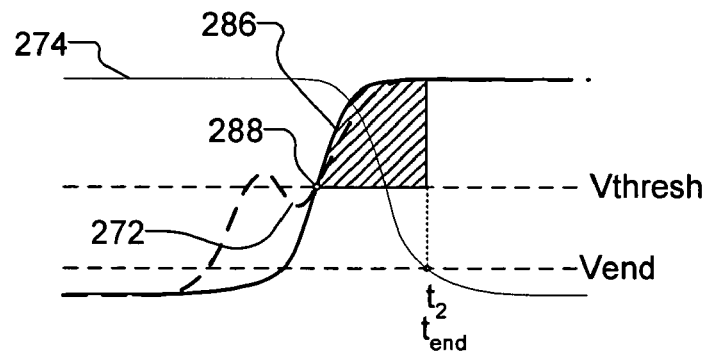

In another embodiment, the equivalent waveform is formed by positioning the first non-distorted waveform such that it has the same delay as the distorted waveform and scaling the first non-distorted waveform (from block 201) so that the end of the transition period for the scaled non-distorted waveform coincides with the end of the transition period for the distorted waveform. In this embodiment, the equivalent waveform has the same delay as the distorted waveform but has a different slew such that the equivalent waveform has the same transition quantity and has a transition period that ends at the same time as the distorted waveform. FIG. 5D graphically illustrates forming the equivalent waveform 286 by scaling the non-distorted input waveform 262 (shown in FIG. 5A) until the end of the transition period of the scaled non-distorted waveform, i.e., time $t_2$ coincides with the end of the transition period of the actual distorted input waveform 272, i.e., time $t_{end}$. The equivalent waveform 286 also has the same delay as the distorted waveform 272, as indicated by crossover point 288, and has the same transition quantity indicated by the hatched area. Thus, as can be seen in FIG. 5D, the equivalent waveform 286 need not have the same shape as the first non-distorted waveform 262.

It should be understood that if desired, the equivalent waveform may be formed by both scaling and shifting the non-distorted waveform, i.e., both the delay and the slew are altered while maintaining the same transition quantity.

The use of a quantitative characteristic such as the transition quantity, in accordance with the present invention, is more robust than conventional trip-point based methods of determining equivalent waveforms. By way of example, FIGS. 6A and 6B, illustrate possible incorrect results caused by the trip-point based method using distorted waveforms 292 and 294, which are nearly identical except that waveform 292 crosses the threshold voltage $V_{thresh}$ multiple times and waveform 294 crosses the threshold voltage $V_{thresh}$ only once. As can be seen, if the last crossing point of the threshold voltage $V_{thresh}$ is used as the delay trip point, the location of the trip-point 293 may vary greatly in waveform 292 in FIG. 6A, from the trip point 295 for waveform 294 in FIG. 6B.

On the other hand, using the transition quantity of the waveform, in accordance with the present invention, is less sensitive to the crossing points of the threshold voltage $V_{thresh}$, as illustrated by waveforms 292 and 294 in FIGS. 7A and 7B. As can be seen, the end of the transition periods for waveforms 292 and 294, indicated by times $t_{end(292)}$ and $t_{end(294)}$, respectively, varies little.

Additionally, using the transition quantity advantageously permits modeling of the so-called load dependency effect (the best equivalent waveform for a given distorted waveform is also functions of the receiving cell characteristics and its load capacitance), as illustrated in FIGS. 8A and 8B. For example, when a large load is present, a great amount of transition is required, as illustrated by arrow 296 in FIG. 8A. However, where a small load is present, only a small amount of transition is necessary, as illustrated by arrows 298 in FIG. 8B.

The use of the transition quantity, in accordance with the present invention, increases timing analysis accuracy. FIGS. 9A and 9B illustrate the increased accuracy of the present invention. FIG. 9A graphically compares the delays in a plurality of cells as determined using circuit simulator Spice against the delays as determined using the conventional trip-point based method. FIG. 9B, on the other hand, compares the delays as determined using Spice against the delays as determined using the transition quantity to form equivalent waveforms according to the present invention. As can be seen, using the transition quantity to form equivalent waveforms results in a much more accurate determination of the delays.

FIG. 10 illustrates the path slack comparison for a multi-million gate industrial design for the top fifty paths, where the solid bars illustrate the absolute slack value using the conventional trip-point based method and the striped bars illustrate the absolute slack value for the transition quantity based method. As can be seen in FIG. 10, the transition quantity based method results in a consistent reduction in the absolute slack value. The average path delay reduction illustrated in FIG. 10 is 371 ps.

Additionally, the present invention uses only information that is conventionally available in the library for static timing analysis, such as the delay and slew. No additional characterization is required for the present invention. Moreover, unlike conventional curve fitting based techniques, such as least square fitting and weighted least square fitting, which requires performing minimization of an integral based cost function, the present invention is fast, as it requires only one scan of the distorted waveform, making the present invention suitable for real time static timing analysis and implementation tools.

Figure 11:
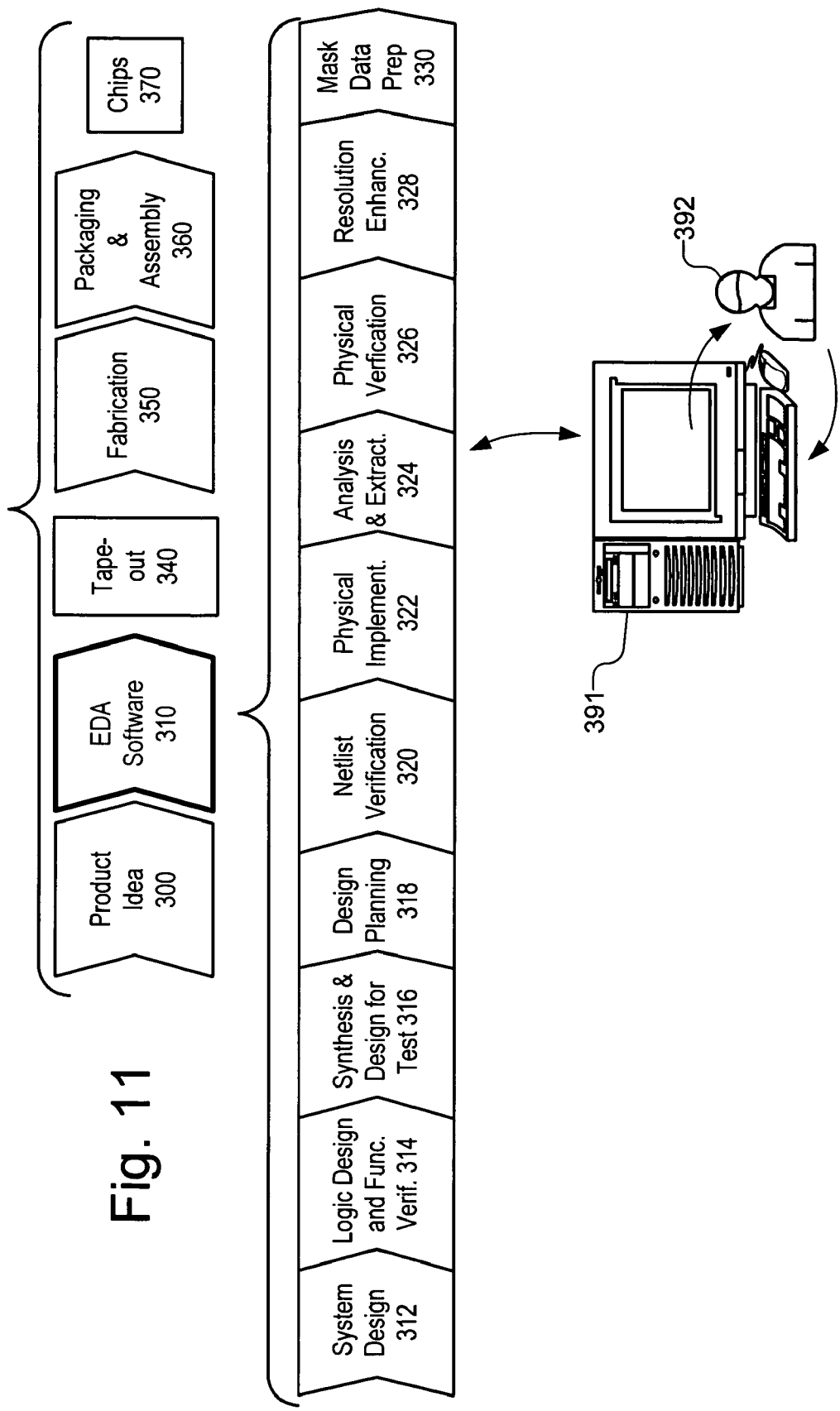
FIG. 11 shows a simplified representation of an exemplary digital ASIC design flow.

It may be helpful to place this process in context. FIG. 11 shows a simplified representation of an exemplary digital ASIC design flow. At a high level, the process starts with the product idea (300) and is realized in an EDA software design process (310). When the design is finalized, it can be taped-out (event 340). After tape out, the fabrication process (350) and packaging and assembly processes (360) occur resulting, ultimately, in finished chips (result 370).

The EDA software design process (310) is actually composed of a number of stages 312-330, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC. A brief description of the components of the EDA software design process (stage 310) will now be provided.

In the system design stage 312, the circuit designers describe the functionality to be implemented, perform what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

In the logic design and functional verification stage 314, the VHDL or Verilog code for modules in the system is written and the design (which may be of mixed clock domains) is checked for functional accuracy. More specifically, the design is checked to ensure that it produces the correct outputs. Exemplary EDA software products from Synopsys, Inc. that can be used at this stage include VCS, VERA, DesignWare®, Magellan, Formality, ESP and LEDA products.

In the synthesis and design for test stage 316 the VHDL/Verilog is translated to a netlist, which may be optimized for the target technology. Additionally, the design and implementation of tests to permit checking of the finished chip occurs. Exemplary EDA software products from Synopsys, Inc. that can be used at this stage include Design Compiler®, Physical Compiler, Test Compiler, Power Compiler, FPGA Compiler, Tetramax, and DesignWare® products.

An overall floorplan for the chip is constructed and analyzed for timing and top-level routing in the design planning stage 318. Exemplary EDA software products from Synopsys, Inc. that can be used at this stage include Jupiter and Floorplan Compiler products.

In the netlist verification stage 320, the netlist is checked for compliance with timing constraints and for correspondence with the VHDL/Verilog source code. Exemplary EDA software products from Synopsys, Inc. that can be used at this stage include VCS, VERA, Formality and Prime Time products.

The placement (positioning of circuit elements) and routing (connection of the same) occurs in the physical implementation stage 322. Exemplary EDA software products from Synopsys, Inc. that can be used at this stage include the Astro product.

At the analysis and extraction stage 324 the circuit function is verified at a transistor or cell level, this in turn permits what-if refinement. This stage includes the static timing analysis (STA) described above, as well as parametric extraction (e.g. capacitance) tools. Exemplary EDA software products from Synopsys, Inc. that can be used at the at the extraction stage include Star RC/XT, Raphael, and Aurora products followed by tools at the analysis stage which include Prime Time SI.

In this stage 324, the extraction tools extract the resistance, capacitance, and cross-coupling capacitance properties of circuit elements and provide them to the analysis tools. Moreover, the analysis tools in this stage 324 produce data indicative of the effect of circuit elements on various design-specific attributes, such as timing, signal integrity, power, and electro migration. A graphical display of data from the analysis and extraction stage 324 may be created by a graphical user interface (GUI) tool called IC Workbench available from Synopsys. The graphical display is provided on a video monitor of a computer 391 at which a designer 392 is working to design the integrated circuit (IC) chip. Designer 392 visually inspects the displayed results and if certain circuit elements do not satisfy a constraint (such as a timing constraint), the designer may re-design certain portions of the circuit to meet the constraint, e.g. in stage 316. Then the above-described stages 318, 320, and 322 are repeated. Reports from this stage, showing the values of design-specific attributes for certain (or all) circuit elements can be displayed to the circuit designer.

During the physical verification stage 326, various checking functions are performed to ensure correctness for: manufacturing, electrical issues, lithographic issues, and circuitry. Exemplary EDA software products from Synopsys, Inc. that can be used for this include the Hercules product.

The resolution enhancement stage 328 involves geometric manipulations of the layout to improve manufacturability of the design. Exemplary EDA software products from Synopsys, Inc. that can be used at this include iN-Phase, Proteus, and AFGen products.

The mask data preparation stage 330 provides the "tape-out" data for production of masks for lithographic use to produce finished chips. Exemplary EDA software products from Synopsys, Inc. that can be used for this include the CATS(R) family of products.

The data structures and software code for automatically implementing one or more acts described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet. In one embodiment, the carrier wave includes computer instruction signals for carrying out the above described process.

Numerous modifications and adaptations of the embodiments described herein will become apparent to the skilled artisan in view of this disclosure and are encompassed by the scope of the invention.

What is claimed is:

1. A method of generating an equivalent waveform of a distorted input waveform for an element in an integrated circuit design, the method being performed in a computer, the method comprising:
   automatically generating a first non-distorted input waveform for the element;
   automatically computing a transition quantity for the first non-distorted input waveform that is required for the element to produce an output waveform, the transition quantity being determined during a first transition period;
   automatically determining the end of a second transition period during which the distorted input waveform accumulates the same transition quantity; and
   automatically computing a second non-distorted input waveform having the same transition quantity as the distorted input waveform, the second non-distorted input waveform having a transition period that terminates at the same time as the end of the second transition period, wherein the second non-distorted input waveform is the equivalent waveform.

2. The method of claim 1, wherein computing a second non-distorted input waveform comprises:
   computing the second non-distorted input waveform with a slew that is the same as the slew of the first non-distorted input waveform and a delay that is different than the delay of the distorted input waveform so that the end of the transition period of the second non-distorted input waveform is aligned with the end of the second transition period for the distorted input waveform.

3. The method of claim 1, wherein computing a second non-distorted input waveform comprises:
   computing the second non-distorted input waveform with a delay that is the same as the delay of the distorted input waveform and a slew that is different than the slew of the first non-distorted input waveform so that the end of the transition period for the second non-distorted input waveform is aligned with the end of the second transition period for the distorted input waveform.

4. The method of claim 1, wherein computing the transition quantity for the first non-distorted input waveform comprises:
   calculating the area between a curve that describes the first non-distorted input waveform and a threshold voltage for the element during the first transition period, the first transition period comprising the time between when the first non-distorted input waveform crosses the threshold voltage and when the output waveform crosses a predefined end voltage.

5. The method of claim 4, wherein:
   the threshold voltage is at least one of transistor threshold voltage and a delay trip point of the element.

6. The method of claim 4, wherein:
the predefined end voltage is chosen as having a value x, wherein x satisfies the following: 5%≦x≦50% of a rail to rail voltage of the element for a falling output waveform and 50%≦x≦95% of the rail to rail voltage of the element for a rising output waveform.

7. The method of claim 4, wherein the transition quantity is determined by:

$$TQ = \int_{t_1}^{t_2} (V_{in}(t) - V_{thresh})^\alpha dt$$

where TQ is the transition quantity, $V_{in}(t)$ describes the first non-distorted input waveform, $V_{thresh}$ is the threshold voltage, $\alpha$ is a weighting factor, $t_1$ is the time when the first non-distorted input waveform crosses the threshold voltage, and $t_2$ is when the output waveform crosses the predefined end voltage.

8. The method of claim 7 wherein the weighting factor $\alpha$ is equal to or greater than 1 and less than or equal to 2.

9. The method of claim 1 wherein determining the end of a second transition period during which the distorted input waveform accumulates the same transition quantity comprises:
finding the end of the second transition period using the area between a curve that describes the distorted input waveform and a threshold voltage for the element, wherein the second transition period begins when the distorted input waveform crosses the threshold voltage.

10. The method of claim 9 wherein the end of the second transition period is determined using:

$$TQ = \int_{t_{start}}^{t_{end}} (V_{in}^*(t) - V_{thresh})^\alpha dt$$

where TQ is the transition quantity, $V^*_{in}(t)$ describes the distorted input waveform, $V_{thresh}$ is the threshold voltage, $\alpha$ is a weighting factor, $t_{start}$ is the beginning of the second transition period, and $t_{end}$ is the end of the second transition period.

11. The method of claim 1 wherein:
the element comprises at least one of a circuit cell and a transistor in an integrated circuit design.

12. A carrier wave encoded with instructions to perform the method of claim 1.

13. A computer-readable storage medium encoded with instructions to perform the method of claim 1.

14. A computer comprising a processor and a memory coupled to the processor, the memory being encoded with instructions to generate an equivalent waveform of a distorted input waveform for an element in an integrated circuit design, wherein the instructions:
automatically generate a first non-distorted input waveform for the element;
automatically compute a transition quantity for the first non-distorted input waveform that is required for the element to produce an output waveform, the transition quantity being determined during a first transition period;
automatically determine the end of a second transition period during which the distorted input waveform accumulates the same transition quantity; and
automatically compute a second non-distorted input waveform having the same transition quantity as the distorted input waveform at the end of the second transition period, wherein the second non-distorted input waveform is the equivalent waveform.

15. The computer of claim 14, wherein the instructions to automatically compute the second non-distorted input waveform automatically computes the second non-distorted input waveform with a slew that is the same as the slew of the first non-distorted input waveform and a delay that is different than the delay of the distorted input waveform so that the end of the transition period of the second non-distorted input waveform is aligned with the end of the second transition period for the distorted input waveform.

16. The computer of claim 14, the instructions to automatically compute a second non-distorted input waveform automatically computes the second non-distorted input waveform with a delay that is the same as the delay of the distorted input waveform and a slew that is different than the slew of the first non-distorted input waveform so that the end of the transition period for the second non-distorted input waveform is aligned with the end of the second transition period for the distorted input waveform.

17. An apparatus for generating an equivalent waveform of a distorted input waveform for an element in an integrated circuit design, the apparatus comprising:
a memory;
means for generating a first non-distorted input waveform for the element;
means for computing a transition quantity for the first non-distorted input waveform that is required for the element to produce an output waveform, the transition quantity being determined during a first transition period;
means for determining the end of a second transition period during which the distorted input waveform accumulates the same transition quantity;
wherein the first non-distorted input waveform and the distorted input waveform are generated on-the-fly by the apparatus, and characteristics of the element are stored in the memory; and
means for computing a second non-distorted input waveform having the same transition quantity as the distorted input waveform at the end of the second transition period, wherein the second non-distorted input waveform is the equivalent waveform.

18. The apparatus of claim 17, wherein the means for computing a second non-distorted input waveform automatically computes the second non-distorted input waveform with a slew that is the same as the slew of the first non-distorted input waveform and a delay that is different than the delay of the distorted input waveform so that the end of the transition period of the second non-distorted input waveform is aligned with the end of the second transition period for the distorted input waveform.

19. The apparatus of claim 17, wherein the means for computing a second non-distorted input waveform automatically computes the second non-distorted input waveform with a delay that is the same as the delay of the distorted input waveform and a slew that is different than the slew of the first non-distorted input waveform so that the end of the transition period for the second non-distorted input waveform is aligned with the end of the second transition period for the distorted input waveform.

* * * * *